United States Patent
Hausmann

(10) Patent No.: US 9,548,188 B2
(45) Date of Patent: Jan. 17, 2017

(54) METHOD OF CONDITIONING VACUUM CHAMBER OF SEMICONDUCTOR SUBSTRATE PROCESSING APPARATUS

(71) Applicant: Lam Research Corporation, Fremont, CA (US)

(72) Inventor: Dennis Michael Hausmann, Lake Oswego, OR (US)

(73) Assignee: Lam Research Corporation, Fremont, CA (US)

(*) Notice: Subject to any disclaimer, the term of this patent is extended or adjusted under 35 U.S.C. 154(b) by 239 days.

(21) Appl. No.: 14/446,427

(22) Filed: Jul. 30, 2014

(65) Prior Publication Data

US 2016/0035542 A1    Feb. 4, 2016

(51) Int. Cl.

| | |
|---|---|
| *H01L 21/311* | (2006.01) |
| *H01J 37/32* | (2006.01) |
| *H01L 21/3065* | (2006.01) |
| *H01L 39/24* | (2006.01) |
| *H01L 21/28* | (2006.01) |
| *C23C 16/30* | (2006.01) |
| *C23C 16/44* | (2006.01) |
| *C23C 16/455* | (2006.01) |
| *C23C 16/509* | (2006.01) |

(Continued)

(52) U.S. Cl.
CPC ......... *H01J 37/32449* (2013.01); *C23C 16/30* (2013.01); *C23C 16/4404* (2013.01); *C23C 16/45525* (2013.01); *C23C 16/509* (2013.01); *H01J 37/32091* (2013.01); *H01J 37/32862* (2013.01); *H01L 21/28194* (2013.01); *H01L 21/3065* (2013.01); *H01L 21/30655* (2013.01); *H01L 39/247* (2013.01); *B05D 1/36* (2013.01); *B05D 1/60* (2013.01)

(58) Field of Classification Search
CPC ............................................. H01L 2224/03827
See application file for complete search history.

(56) References Cited

U.S. PATENT DOCUMENTS

| | | |
|---|---|---|
| 5,589,233 A | 12/1996 | Law et al. |
| 5,710,213 A | 1/1998 | Stein |

(Continued)

FOREIGN PATENT DOCUMENTS

| | | |
|---|---|---|
| CN | 103219226 A | 7/2013 |
| CN | 103352205 A | 10/2013 |

(Continued)

*Primary Examiner* — Binh X Tran
(74) *Attorney, Agent, or Firm* — Buchanan Ingersoll & Rooney PC

(57) ABSTRACT

A method of conditioning a vacuum chamber of a semiconductor substrate processing apparatus includes forming a layer of an organic polymeric film on plasma or process gas exposed surfaces thereof. The method includes: (a) flowing a first reactant in vapor phase of a diacyl chloride into the vacuum chamber; (b) purging the vacuum chamber after a flow of the first reactant has ceased; (c) flowing a second reactant in vapor phase into the vacuum chamber selected from the group consisting of a diamine, a diol, a thiol, and a trifunctional compound to form a layer of an organic polymeric film on the plasma or process gas exposed surfaces of the vacuum chamber; and (d) purging the vacuum chamber to purge excess second reactant and reaction byproducts from the vacuum chamber.

15 Claims, 8 Drawing Sheets

(51) Int. Cl.
*B05D 1/36* (2006.01)
*B05D 1/00* (2006.01)

(56) References Cited

U.S. PATENT DOCUMENTS

| | | | |
|---|---|---|---|
| 6,096,661 A | 8/2000 | Ngo et al. |
| 6,121,161 A | 9/2000 | Rossman et al. |
| 6,323,119 B1 | 11/2001 | Xi et al. |
| 6,403,501 B1 | 6/2002 | Hander et al. |
| 6,416,577 B1 | 7/2002 | Suntoloa et al. |
| 6,479,098 B1 | 11/2002 | Yoo et al. |
| 6,534,423 B1 | 3/2003 | Turner |
| 6,626,188 B2 | 9/2003 | Fitzsimmons et al. |
| 6,720,259 B2 | 4/2004 | Londergan et al. |
| 6,815,007 B1 | 11/2004 | Yoo et al. |
| 7,118,779 B2 | 10/2006 | Verghese et al. |
| 7,232,492 B2 | 6/2007 | Won et al. |
| 7,288,284 B2 | 10/2007 | Li et al. |
| 7,381,644 B1 | 6/2008 | Subramonium et al. |
| 7,595,271 B2 | 9/2009 | White |
| 7,659,184 B2 | 2/2010 | Vellaikal et al. |
| 7,704,894 B1 | 4/2010 | Henri et al. |
| 7,727,906 B1 | 6/2010 | Shanker et al. |
| 7,767,584 B1 | 8/2010 | Singh et al. |
| 7,799,135 B2 | 9/2010 | Verghese et al. |
| 7,906,817 B1 | 3/2011 | Wu et al. |
| 7,914,847 B2 | 3/2011 | Verghese et al. |
| 7,915,166 B1 | 3/2011 | Yu et al. |
| 7,923,376 B1 | 4/2011 | Dhas et al. |
| 7,955,990 B2 | 6/2011 | Henri et al. |
| 7,968,439 B2 | 6/2011 | Li et al. |
| 7,981,777 B1 | 7/2011 | Subramonium et al. |
| 7,981,810 B1 | 7/2011 | Subramonium et al. |
| 8,034,725 B1 | 10/2011 | Henri et al. |
| 8,100,081 B1 | 1/2012 | Henri et al. |
| 8,110,493 B1 | 2/2012 | Subramonium et al. |
| 8,273,403 B2 | 9/2012 | Barden et al. |
| 8,293,658 B2 | 10/2012 | Shero et al. |
| 8,362,571 B1 | 1/2013 | Wu et al. |
| 8,435,608 B1 | 5/2013 | Subramonium et al. |
| 8,491,967 B2 | 7/2013 | Ma et al. |
| 8,492,676 B2 | 7/2013 | Azuma et al. |
| 8,563,414 B1 | 10/2013 | Fox et al. |
| 8,591,659 B1 | 11/2013 | Fang et al. |
| 8,592,328 B2 | 11/2013 | Hausmann et al. |
| 8,637,411 B2 | 1/2014 | Swaminathan et al. |
| 8,642,128 B2 | 2/2014 | Choi et al. |
| 8,647,993 B2 | 2/2014 | Lavoie et al. |
| 8,669,181 B1 | 3/2014 | Yu et al. |
| 9,228,259 B2 | 1/2016 | Haukka et al. |
| 2003/0013314 A1 | 1/2003 | Ying et al. |
| 2003/0143410 A1 | 7/2003 | Won et al. |
| 2004/0023516 A1 | 2/2004 | Londergan et al. |
| 2004/0221807 A1 | 11/2004 | Verghese et al. |
| 2005/0221020 A1 | 10/2005 | Fukiage |
| 2005/0230047 A1* | 10/2005 | Collins .............. H01J 37/32082 156/345.33 |
| 2006/0093756 A1 | 5/2006 | Rajagopalan et al. |
| 2006/0189171 A1 | 8/2006 | Chua et al. |
| 2006/0222771 A1 | 10/2006 | Seamons et al. |
| 2006/0280868 A1 | 12/2006 | Kato et al. |
| 2007/0051470 A1 | 3/2007 | Iwakoshi et al. |
| 2007/0065578 A1 | 3/2007 | McDougall |
| 2007/0201016 A1 | 8/2007 | Song et al. |
| 2007/0281083 A1 | 12/2007 | Lakshmanan et al. |
| 2008/0216302 A1 | 9/2008 | Cheung et al. |
| 2008/0254233 A1 | 10/2008 | Lee et al. |
| 2008/0254641 A1* | 10/2008 | Kobayashi ........ H01L 21/02118 438/763 |
| 2009/0197401 A1* | 8/2009 | Li ........................ C23C 14/48 438/513 |
| 2009/0242511 A1 | 10/2009 | Shimazu et al. |
| 2011/0091650 A1 | 4/2011 | Noguchi et al. |
| 2011/0256724 A1 | 10/2011 | Chandrasekharan et al. |
| 2011/0256726 A1 | 10/2011 | Lavoie et al. |
| 2012/0009356 A1 | 1/2012 | Choi et al. |
| 2012/0204795 A1 | 8/2012 | Padhi et al. |
| 2013/0064973 A1 | 3/2013 | Chen et al. |
| 2013/0177706 A1 | 7/2013 | Baluja et al. |
| 2013/0189854 A1 | 7/2013 | Hausmann et al. |
| 2013/0316518 A1 | 11/2013 | Hollister et al. |
| 2014/0053867 A1 | 2/2014 | Fang et al. |
| 2014/0113457 A1 | 4/2014 | Sims et al. |
| 2015/0155177 A1* | 6/2015 | Zhang ................ H01L 21/3065 438/719 |

FOREIGN PATENT DOCUMENTS

| | | |
|---|---|---|
| CN | 103526177 A | 1/2014 |
| KR | 20110074904 A | 7/2011 |

* cited by examiner

METHOD OF CONDITIONING VACUUM CHAMBER OF SEMICONDUCTOR SUBSTRATE PROCESSING APPARATUS

FIELD OF THE INVENTION

This invention pertains to coatings formed by atomic layer deposition and/or molecular layer deposition, and may find particular use in coating plasma or process gas exposed surfaces of chamber components of a vacuum chamber of a semiconductor substrate processing apparatus.

BACKGROUND

Semiconductor substrate processing apparatuses are used to process semiconductor substrates (also referred to herein as substrates, semiconductor wafers, or wafers) in a vacuum chamber thereof by techniques including etching, physical vapor deposition (PVD), chemical vapor deposition (CVD), plasma enhanced chemical vapor deposition (PECVD), atomic layer deposition (ALD), plasma enhanced atomic layer deposition (PEALD), pulsed deposition layer (PDL), molecular layer deposition (MLD), plasma enhanced molecular layer deposition (PEMLD), conformal film deposition (CFD), plasma enhanced pulsed deposition layer (PEPDL) processing, and resist removal. Semiconductor substrate processing apparatuses, such as the aforementioned processing apparatuses, can comprise a plurality of exposed surfaces of the vacuum chamber which are exposed to plasma and/or process gases during semiconductor substrate processing. The plasma or process gas exposed surfaces of the vacuum chamber may release harmful contaminants during the processing of semiconductor substrates and can contaminate a semiconductor substrate being processed. For example, an plasma or process gas exposed surface of a chamber component of the vacuum chamber can outgas undesirable elements such as aluminum (Al), iron (Fe), sodium (Na), copper (Cu), and the like. These contaminants can be released from the plasma or process gas exposed surfaces of the vacuum chamber components due to chemical reactions with process gas introduced into the chamber or plasma generated in the chamber. For example, atomic layer deposition (ALD) processing using halogen gases such as chlorine (Cl), bromine (Br), iodine (I), and the like can extract metals such as Cu, Na and Fe from the plasma or process gas exposed surfaces of vacuum chamber components and can lead to metal contamination of a film being deposited on a semiconductor substrate in the vacuum chamber of the semiconductor substrate processing apparatus.

SUMMARY

Disclosed herein is a method of conditioning a vacuum chamber of a semiconductor substrate processing apparatus in which semiconductor substrates are processed. The method of conditioning the vacuum chamber includes forming a layer of an organic polymeric film on plasma or process gas exposed surfaces of the vacuum chamber. The method of forming the layer of the organic polymeric film includes: (a) flowing a first reactant in vapor phase of a diacyl chloride into the vacuum chamber and allowing the first reactant to adsorb onto plasma or process gas exposed surfaces of the vacuum chamber; (b) purging the vacuum chamber with a purge gas after a flow of the first reactant has ceased to purge excess first reactant from the vacuum chamber; (c) flowing a second reactant in vapor phase into the vacuum chamber selected from the group consisting of a diamine, a diol, a thiol, and a trifunctional compound wherein the first and second reactants react to form a layer of an organic polymeric film on the plasma or process gas exposed surfaces of the vacuum chamber; and (d) purging the vacuum chamber with the purge gas after a flow of the second reactant has ceased to purge excess second reactant and reaction byproducts from the vacuum chamber.

Also disclosed herein is a semiconductor substrate processing apparatus comprising a vacuum chamber including a processing zone in which a semiconductor substrate is processed. The semiconductor substrate processing apparatus includes a mass flow controller which supplies process gases to the vacuum chamber and a controller which operates the mass flow controller. The mass flow controller is adapted to supply first reactant gas, second reactant gas, and purge gas to form an organic polymeric film on plasma or process gas exposed surfaces of the vacuum chamber and process gases which deposit a film on the semiconductor substrate. The controller is adapted to operate the mass flow controller to effect forming the organic polymeric film on the plasma or process gas exposed surfaces of vacuum chamber. The controller is further adapted to operate the mass flow controller to effect deposition of a film on a semiconductor substrate in the vacuum chamber.

DETAILED DESCRIPTION

In the following detailed description, numerous specific embodiments are set forth in order to provide a thorough understanding of the apparatus and methods disclosed herein. However, as will be apparent to those skilled in the art, that the present embodiments may be practiced without these specific details or by using alternate elements or processes. In other instances, well-known processes, procedures, and/or components have not been described in detail so as not to unnecessarily obscure aspects of embodiments disclosed herein. As used herein the term "about" refers to ±10%.

Present embodiments provide methods and apparatus for conditioning plasma or process gas exposed surfaces of a vacuum chamber of a semiconductor substrate processing apparatus wherein the conditioning includes forming an organic polymeric film on plasma or process gas exposed surfaces of the vacuum chamber. The semiconductor substrate processing apparatus and methods disclosed herein are particularly applicable to use in conjunction with a chemical deposition vacuum chamber (as used herein "vacuum chamber") of a chemical deposition apparatus or plasma enhanced chemical deposition apparatus wherein a semiconductor fabrication deposition process can be performed which uses self-limiting deposition steps. Accordingly, embodiments of methods disclosed herein can be performed in semiconductor substrate processing apparatuses such as an atomic layer deposition (ALD) apparatus, plasma enhanced atomic layer deposition (PEALD) apparatus, pulsed deposition layer (PDL) apparatus, plasma enhanced pulsed deposition layer (PEPDL) apparatus, conformal film deposition (CFD) apparatus, molecular layer deposition (MLD) apparatus, plasma enhanced molecular layer deposition (PEMLD) apparatus, however they are not so limited. For example, further semiconductor substrate processing apparatuses can include a plasma etching apparatus, a physical vapor deposition (PVD) apparatus, chemical vapor deposition (CVD) apparatus, and resist removal apparatus, wherein embodiments of methods disclosed herein can be performed.

Figure 1:
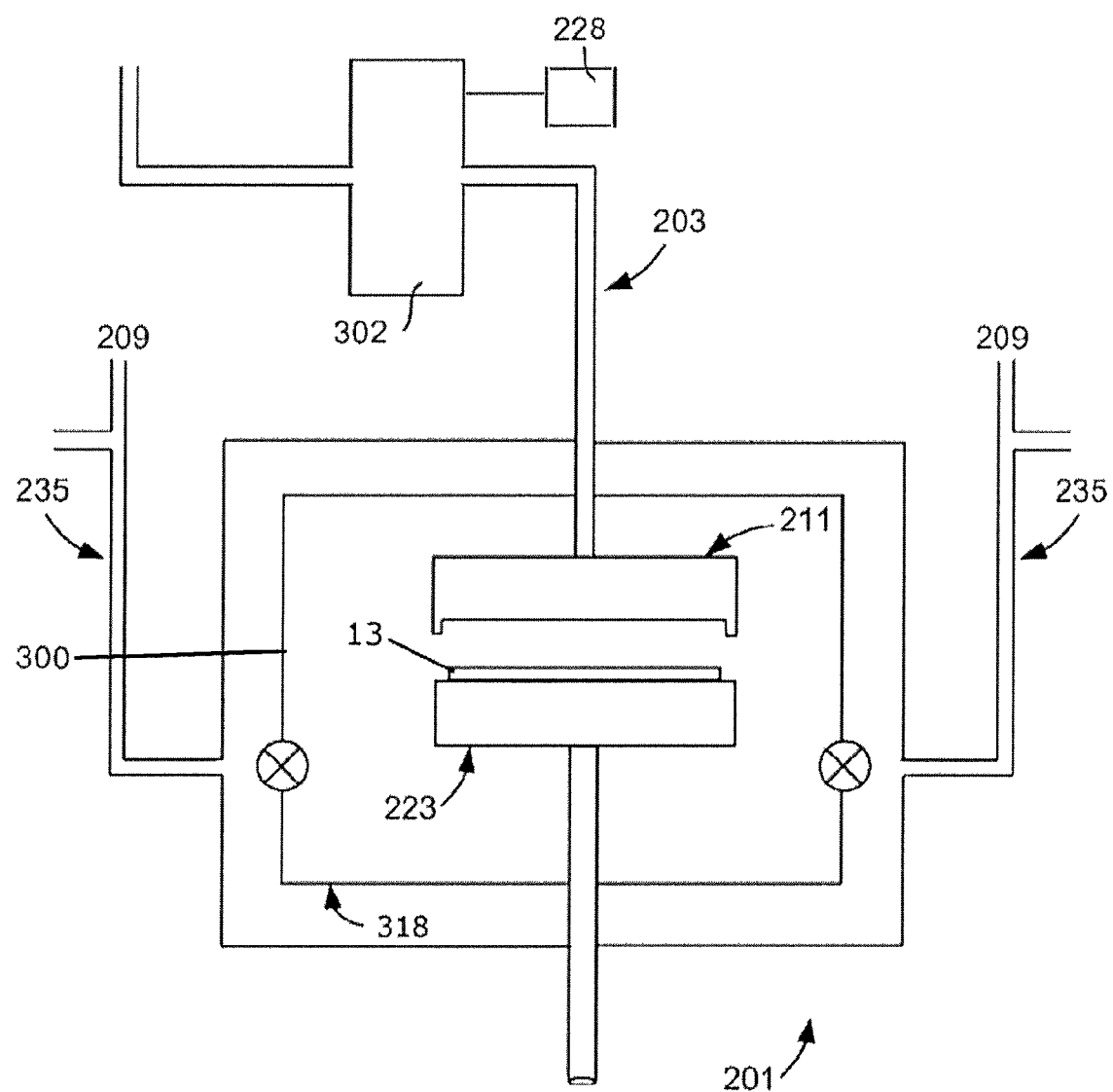
FIG. 1 illustrates a schematic diagram showing relevant basic features of a chemical deposition apparatus in accordance with embodiments disclosed herein.

FIG. 1 is a schematic diagram showing an overview of a chemical deposition vacuum chamber 201 (vacuum chamber) in accordance with embodiments disclosed herein wherein plasma or process gas exposed surfaces 300 of the vacuum chamber 201 can include the organic polymeric film according to embodiments as disclosed herein. A semiconductor substrate 13 sits on top of a movable pedestal module 223 that can be raised or lowered relative to a showerhead module 211, which may also be moved vertically. Reactant material gases are introduced into a processing zone 318 of the vacuum chamber 201 via gas line 203 wherein a mass flow controller 302 can control the flow of the reactant material gases introduced into the processing zone 318 of the vacuum chamber 201. For example, the mass flow controller 302 can preferably supply process gases to the vacuum chamber 201 for processing a semiconductor substrate, as well as reactant gases for forming an organic polymeric film on the plasma or process gas exposed surfaces 300 thereof. Note that the apparatus may be modified to have one or more gas lines, depending on the number of reactant gases used. The chamber is evacuated through vacuum lines 235 that are connected to a vacuum source 209. The vacuum source 209 may be a vacuum pump which is operable to evacuate reactants, process gas, and reaction byproducts from the vacuum chamber 201.

Figure 2:
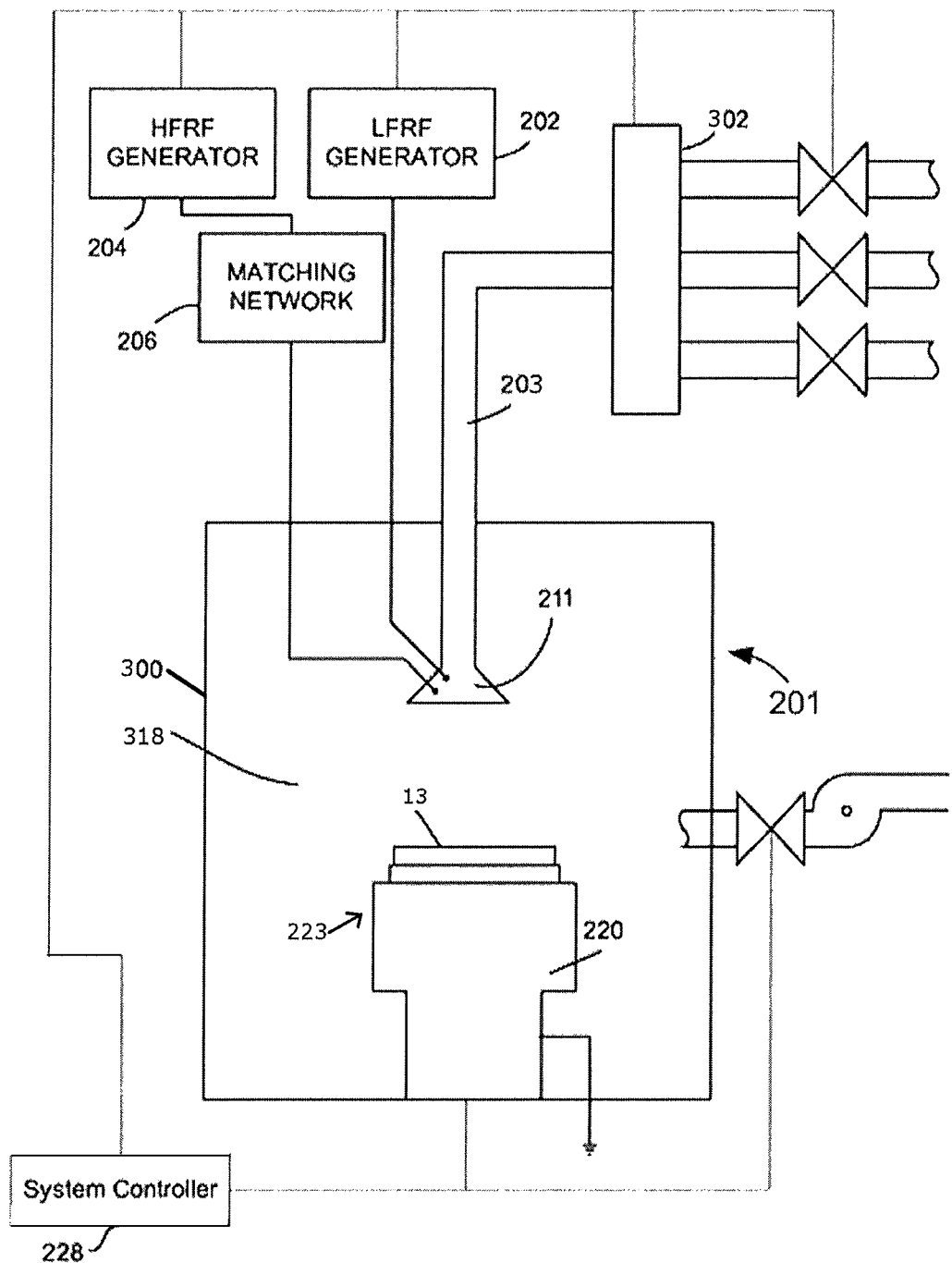
FIG. 2 illustrates a block diagram depicting various apparatus components of a chemical deposition apparatus arranged for implementing embodiments disclosed herein wherein plasma can be utilized to enhance deposition.

Embodiments disclosed herein are preferably implemented in a plasma enhanced chemical deposition apparatus (i.e. PECVD apparatus, PEALD apparatus, PEMLD apparatus, CFD apparatus, or PEPDL apparatus). FIG. 2 provides a simple block diagram depicting various apparatus components arranged for implementing embodiments disclosed herein wherein plasma is utilized to enhance deposition in a plasma enhanced chemical deposition vacuum chamber 201. As shown, a processing zone 318 of the vacuum chamber 201 serves to contain the plasma generated by a capacitively coupled plasma system including a showerhead module 211 working in conjunction with a pedestal module 223, wherein the pedestal module 223 is heated. Reactant material gases are introduced into the processing zone 318 of the vacuum chamber 201 by a mass flow controller 302 via gas line 203. RF source(s), such as at least one high-frequency (HF) RF generator 204, connected to a matching network 206, and an optional low-frequency (LF) RF generator 202 are connected to the showerhead module 211. In an alternative embodiment, the HF generator 204 can be connected to the pedestal module 223. The power and frequency supplied by matching network 206 is sufficient to generate a plasma from the process gas/vapor. In an embodiment both the HF generator 204 and the LF generator 202 are used, and in an alternate embodiment, just the HF generator 204 is used. In a typical process, the HF generator 204 is operated generally at frequencies of about 2-100 MHz; in a preferred embodiment at 13.56 MHz or 27 MHz. The LF generator 202 is operated generally at about 50 kHz to 2 MHz; in a preferred embodiment at about 350 to 600 kHz. The process parameters may be scaled based on the vacuum chamber 201 volume, substrate size, and other factors. Similarly, the flow rates of process gas, may depend on the free volume of the vacuum chamber 201 and/or processing zone 318.

Within the vacuum chamber 201, the pedestal module 223 supports a semiconductor substrate 13 on which materials such as thin films may be deposited. The pedestal module 223 can include a fork or lift pins to hold and transfer the semiconductor substrate during and between the deposition and/or plasma treatment reactions. In an embodiment, the semiconductor substrate 13 may be configured to rest on a surface of the pedestal module 223, however in alternate embodiments the pedestal module 223 may include an electrostatic chuck, a mechanical chuck, or a vacuum chuck for holding the semiconductor substrate 13 on the surface of the pedestal module 223. The pedestal module 223 can be coupled with a heater block 220 for heating semiconductor substrate 13 to a desired temperature. Generally, semiconductor substrate 13 is maintained at a temperature of about 25° C. to 500° C. or greater depending on the material to be deposited.

In an embodiment, a system controller 228 is employed to control process conditions during the method of forming the organic polymeric film on plasma or process gas exposed surfaces 300 of the vacuum chamber, during deposition, post deposition treatments, and/or other process operations. The controller 228 will typically include one or more memory devices and one or more processors. The processor may include a CPU or computer, analog and/or digital input/output connections, stepper motor controller boards, etc.

In an embodiment, the controller 228 controls all of the activities of the apparatus. The system controller 228 executes system control software including sets of instructions for controlling the timing of the processing operations, frequency and power of operations of the LF generator 202 and the HF generator 204, flow rates and temperatures of precursors and inert gases and their relative mixing, temperature of the heater block 220 and showerhead module 211, pressure of the chamber, and other parameters of a particular process. Other computer programs stored on memory devices associated with the controller may be employed in some embodiments.

There can be a user interface associated with controller 228. The user interface may include a display screen, graphical software displays of the apparatus and/or process conditions, and user input devices such as pointing devices, keyboards, touch screens, microphones, etc.

A non-transitory computer machine-readable medium can comprise program instructions for control of the apparatus. The computer program code for controlling the processing operations can be written in any conventional computer readable programming language: for example, assembly language, C, C++, Pascal, Fortran or others. Compiled object code or script is executed by the processor to perform the tasks identified in the program.

The controller 228 parameters relate to process conditions such as, for example, timing of the processing steps, flow rates and temperatures of precursors and inert gases, temperature of the wafer, pressure of the chamber and other parameters of a particular process. These parameters are provided to the user in the form of a recipe, and may be entered utilizing the user interface.

Signals for monitoring the process may be provided by analog and/or digital input connections of the system controller. The signals for controlling the process are output on the analog and digital output connections of the apparatus.

The system software may be designed or configured in many different ways. For example, various chamber component subroutines or control objects may be written to control operation of the chamber components necessary to carry out deposition processes. Examples of programs or sections of programs for this purpose include semiconductor substrate timing of the processing steps code, flow rates and temperatures of precursors and inert gases code, and a code for pressure of the vacuum chamber.

For deposited films, the use of chemistries that react with the semiconductor substrate surroundings (i.e. plasma exposed or process gas exposed surfaces of a vacuum chamber such as chamber walls, a showerhead, a wafer pedestal, etc.) can result in metals contaminants becoming incorporated in a film being deposited on the semiconductor substrate. These contaminates occur due to chemical reactions between the materials that make up the vacuum chamber environment (i.e. ceramics, metals, etc.) and the deposition chemistries used to deposit the film. In embodiments as disclosed herein the top, base, and sidewall of the vacuum chamber can be constructed from any material suitable for the semiconductor process operations, such as metallic, ceramic or quartz materials. For example, a plasma or process gas exposed surface of the vacuum chamber can be formed of aluminum, silicon, aluminum oxide, sapphire, silicon oxide, quartz, silicon nitride, or silicon carbide. Further, as used herein "metal" includes the elemental form and alloy form of the metal. For example, the metallic material can be bare metal or coated metal such as aluminum, anodized aluminum, nickel, nickel alloy, stainless steel, or other suitable metallic material with or without one or more coatings of materials such as yttrium oxide (yttria) and zirconium oxide. The ceramic can include oxide, carbide, and/or nitride materials such as aluminum oxide (alumina), aluminum nitride (AlN), zirconium oxide, yttrium oxide, or other suitable ceramic material. The quartz can be flame-fused natural quartz or other form of quartz such as arc-fused natural quartz, or synthetic quartz, for example.

During a deposition process wherein a film is deposited on a semiconductor substrate, the properties of the deposited film are dependent on the reactants (i.e. precursors) used to form the film. In addition to being the primary determining factor for film properties and composition, the choice of reactants also factors into determining the ultimate cost of the semiconductor substrate processing process. The most cost effective reactants can contain halides (e.g. fluorine, chlorine, bromine, iodine, or astatine halides). Alternate reactants such as amides (for example, $-N(CH_3)_2$, $-NH_2$) are synthesized using halides as starting materials and on average are about ten times more expensive than halides. However, one issue with the use of halide reactants is that hydrogen chloride (HCl) can be formed during the deposition process. The HCl formed during the deposition process aggressively corrodes plasma or process gas exposed metal surfaces of the vacuum chamber and forms metal chlorides. For example, a plasma or process gas exposed surface can react with HCl and form $AlCl_3$ and/or $FeCl_2$ which are especially volatile and can lead to metal contamination of a film being deposited on a semiconductor substrate inside of the vacuum chamber during processing thereof.

Therefore, in order to prevent chamber corrosion, an organic film deposition process can be performed which deposits a conformal film of an organic polymeric material at a rate of up to about 1 nm a deposition cycle. In an embodiment, a deposition cycle is a minimum set of operations required to perform a surface deposition reaction one time. The result of one deposition cycle is the production of a layer of the film being deposited. Therefore, excessively long precoating processes (for example an ALD precoating process for conditioning a vacuum chamber coats chamber surfaces at a rate of about 0.5 to 1 Å a deposition cycle) and/or expensive chamber liners, which were previously used in vacuum chambers are no longer required. Thus, the embodiments of forming an organic polymeric film as disclosed herein can reduce the time required to condition a vacuum chamber, and prevent metal contamination of a film being deposited on a semiconductor substrate in the vacuum chamber.

In an embodiment, a method of conditioning a vacuum chamber of a semiconductor substrate processing apparatus in which semiconductor substrates are processed includes forming an organic polymeric film on plasma or process gas exposed surfaces of the vacuum chamber. The formed organic polymeric film can include carbon, oxygen, hydrogen, nitrogen, sulfur or combinations thereof. Preferably, the organic polymeric film includes only carbon, oxygen, hydrogen, and optionally nitrogen and/or sulfur. In an embodiment the organic polymeric film is preferably free of halogens such as fluorine. In an embodiment the organic polymeric film is free of silicon.

To form the organic polymeric film, a deposition cycle of the method can include (a) flowing a first reactant in vapor phase into the vacuum chamber wherein the first reactant is allowed to adsorb onto plasma or process gas exposed surfaces of the vacuum chamber. The first reactant is preferably a diacyl chloride. Then (b) purging the vacuum chamber with a purge gas after a flow of the first reactant has ceased to purge excess first reactant from the vacuum chamber. Then (c) flowing a second reactant in vapor phase into the vacuum chamber wherein the first and second reactants react to form a layer of an organic polymeric film on the plasma or process gas exposed surfaces of the vacuum chamber. The second reactant is preferably a diamine, a diol, a thiol, or a trifunctional compound. Then (d) purging the vacuum chamber with the purge gas after a flow of the second reactant has ceased to purge excess second reactant and reaction byproducts from the vacuum chamber.

Preferably, the deposition cycle (a)-(d) used to form a layer of the organic polymeric film is repeated such that the layers of the organic polymeric film are formed one on top of the other until the organic polymeric film reaches a predetermined (desired) thickness. The thickness of each formed layer of the organic polymeric film can be about 0.1 to 1 nm wherein the thickness of each formed layer of the organic polymeric film depends on the length of time that the first reactant and the second reactant are flowed into the vacuum chamber, and thereby the saturation level of each the first and second reactants on a plasma or process gas exposed surface of the vacuum chamber. Preferably, the first reactant is flowed into the vacuum chamber for about 0.1 to 10 seconds, the second reactant is flowed into the vacuum chamber for about 0.1 to 10 seconds, and the purging of the first or second reactants is performed for about 1 to 10 seconds, wherein the vacuum chamber can be conditioned to include the organic polymeric film on plasma or process gas exposed surfaces thereof in less than about an hour. In an embodiment, the temperature of the plasma or process gas exposed surfaces during the method of conditioning is about 20° to 350° C. In an embodiment, the pressure in the vacuum chamber during the method of conditioning is about 1 to 4 Torr.

In an embodiment, the first reactant of diacyl chloride can be ethanedioyl dichloride, malonoyl dichloride, succinyl dichloride, pentanedioyl dichloride, or combinations thereof. In an embodiment, the second reactant of a diamine can be 1,2-ethanediamine, 1,3-propanediamine, 1,4-butanediamine, or combinations thereof. In an embodiment, the second reactant of a diol can be ethylene glycol, 1,3-propanediol, 1,4-butanediol, or combinations thereof. In an embodiment, the second reactant of a thiol can be 1,2-ethanedithiol, 1,3-propanedithiol, 1,4-butanedithiol, or combinations thereof. In an embodiment, the second reactant of a trifunctional compound can be (±)-3-amino-1,2-propanediol, glycerol, bis(hexamethylene)triamine, melamine, diethylenetriamine, (±)-1,2,4-butanetriol, cyanuric chloride, or combinations thereof. In an embodiment, the purge gas can be He, Ar, Ne, $H_2$, $N_2$, or combinations thereof. Preferably, terminal ends of the molecules forming the organic polymeric film form a hydroxyl, an amine, or a thiol. For example, if a diamine is used as the second reactant $NH_2$ preferably forms the terminal ends of the molecules forming the organic polymeric film, if a diol is used as the second reactant OH preferably forms the terminal ends of the molecules forming the organic polymeric film, and if a thiol is used as the second reactant SH preferably forms the terminal ends of the molecules forming the organic polymeric film.

Figure 3:
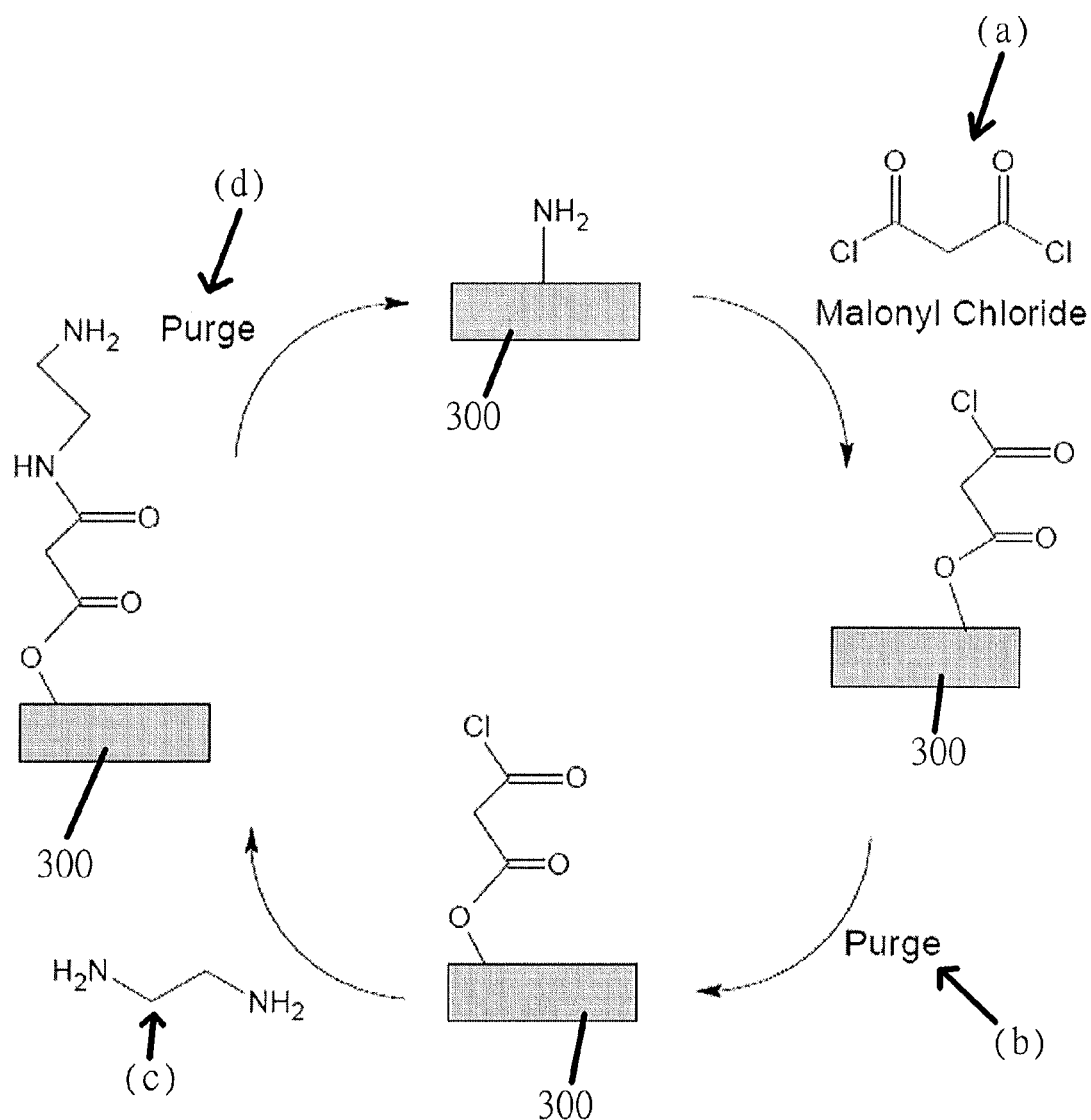
FIG. 3 shows a process schematic of steps to form a layer of an organic polymeric film on a plasma or process gas exposed surface of a vacuum chamber.

FIG. 3 shows a process schematic of the steps (a)-(d) of forming a layer of an organic polymeric film on a plasma or process gas exposed surface 300 of a vacuum chamber. In step (a), a first reactant of malonoyl dichloride is flowed in vapor phase into the vacuum chamber wherein the first reactant adsorbs onto the plasma or process gas exposed surface 300. In step (b), a purge gas is flowed into the vacuum chamber after the flow of the first reactant has ceased, to thus purge excess first reactant rom the vacuum chamber. In step (c), a second reactant of 1,2-ethanediamine is flowed in vapor phase into the vacuum chamber wherein the first and second reactants react to form a layer of an organic polymeric film on the plasma or process gas exposed surface 300 of the vacuum chamber. In step (d), a purge gas is flowed into the vacuum chamber after the flow of the second reactant has ceased. to thus purge excess second reactant and reaction by products from the vacuum chamber. The steps (a)-(d) can be repeated until the organic polymeric film is grown to a desired thickness. In an embodiment of forming the organic polymeric film, a substrate can be supported on a pedestal module inside the vacuum chamber such that the polymeric organic film is not formed on an upper surface of the pedestal module.

In an embodiment the first reactant and the second reactant used to form the organic polymeric film are flowed into the vacuum chamber until they reach about 100% saturation on a plasma or process gas exposed surface of the vacuum chamber such that a layer of the organic polymeric film deposited on the plasma or process gas exposed surface of the vacuum chamber has a maximum thickness. Thus, the time required to deposit the organic polymeric film can be reduced.

Figure 4:
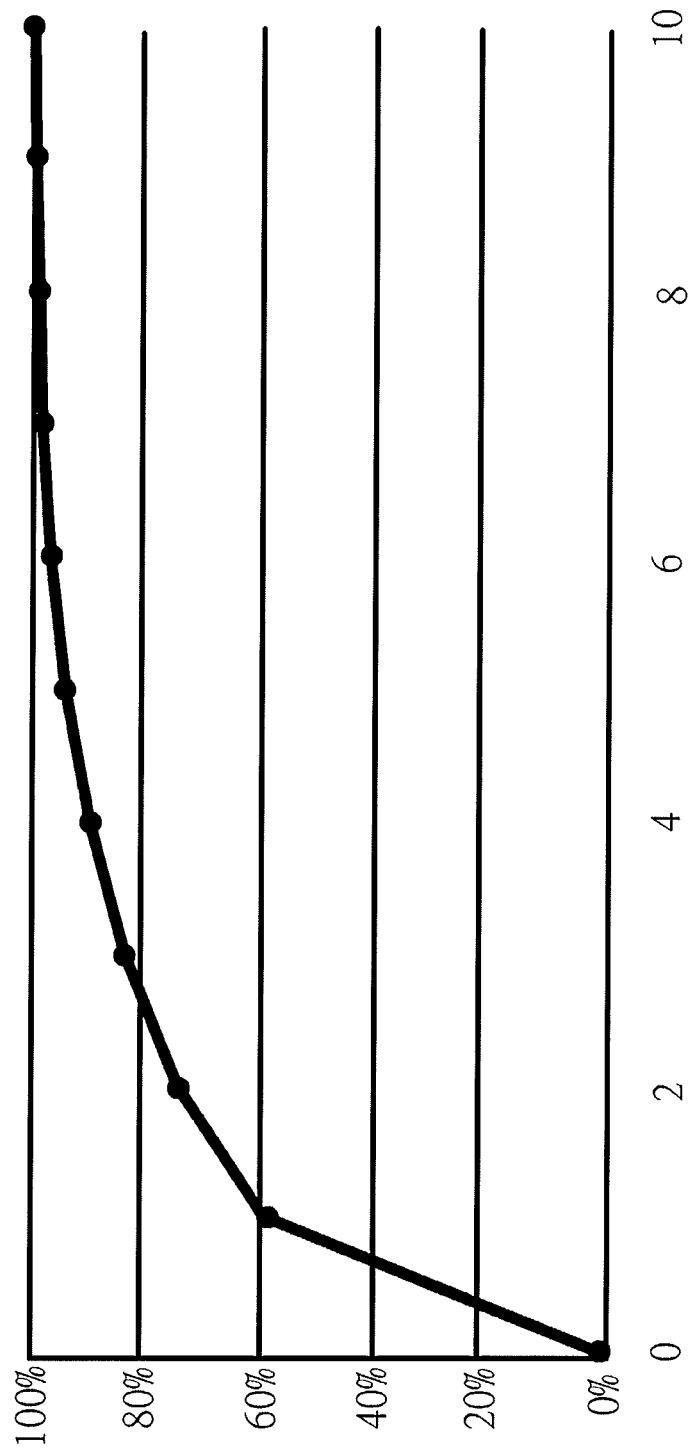
FIG. 4 shows a graph of percent saturation of a reactant being deposited onto the surface of a coupon.
Figure 5:
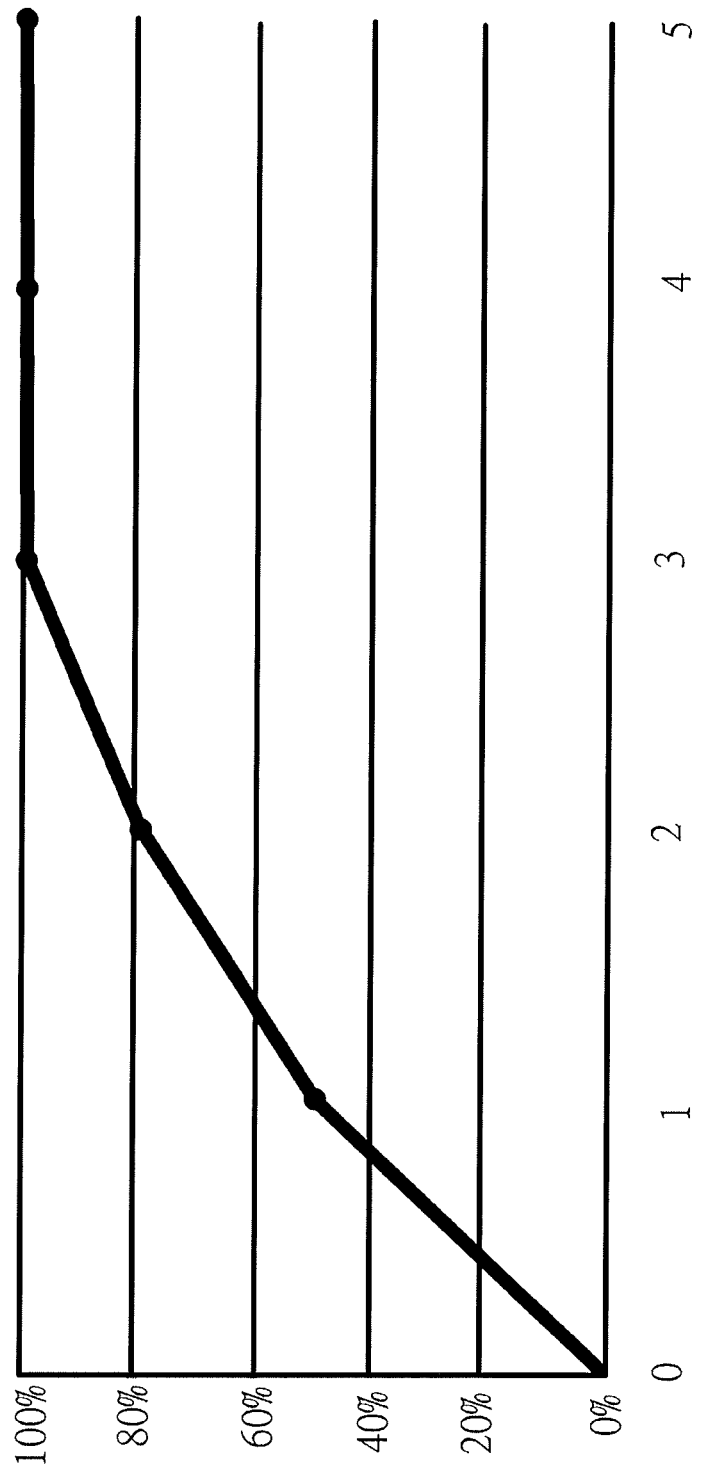
FIG. 5 shows a graph of percent saturation of a reactant being deposited onto the surface of a coupon.

For example, FIG. 4 shows a graph of percent saturation of a first reactant of malonoyl dichloride being deposited onto the surface of a coupon in a vacuum chamber having a continuous pressure of about 2 Torr. The first reactant is flowed in doses lasting about 1 second each wherein a purge gas is flowed for about 5 seconds between each dose of the first reactant. As shown in FIG. 4, the first reactant of malonoyl dichloride reaches about 100% saturation at about 8 doses. FIG. 5 shows a graph of percent saturation of a second reactant of 1,2-ethanediamine being deposited onto the surface of a coupon in a vacuum chamber having a continuous pressure of about 2 Torr. The second reactant is flowed in doses lasting about 1 second each wherein a purge gas is flowed for about 5 seconds between each dose of the second reactant. As shown in FIG. 5, the second reactant of 1,2-ethanediamine reaches about 100% saturation at about 3 seconds.

Figure 6:
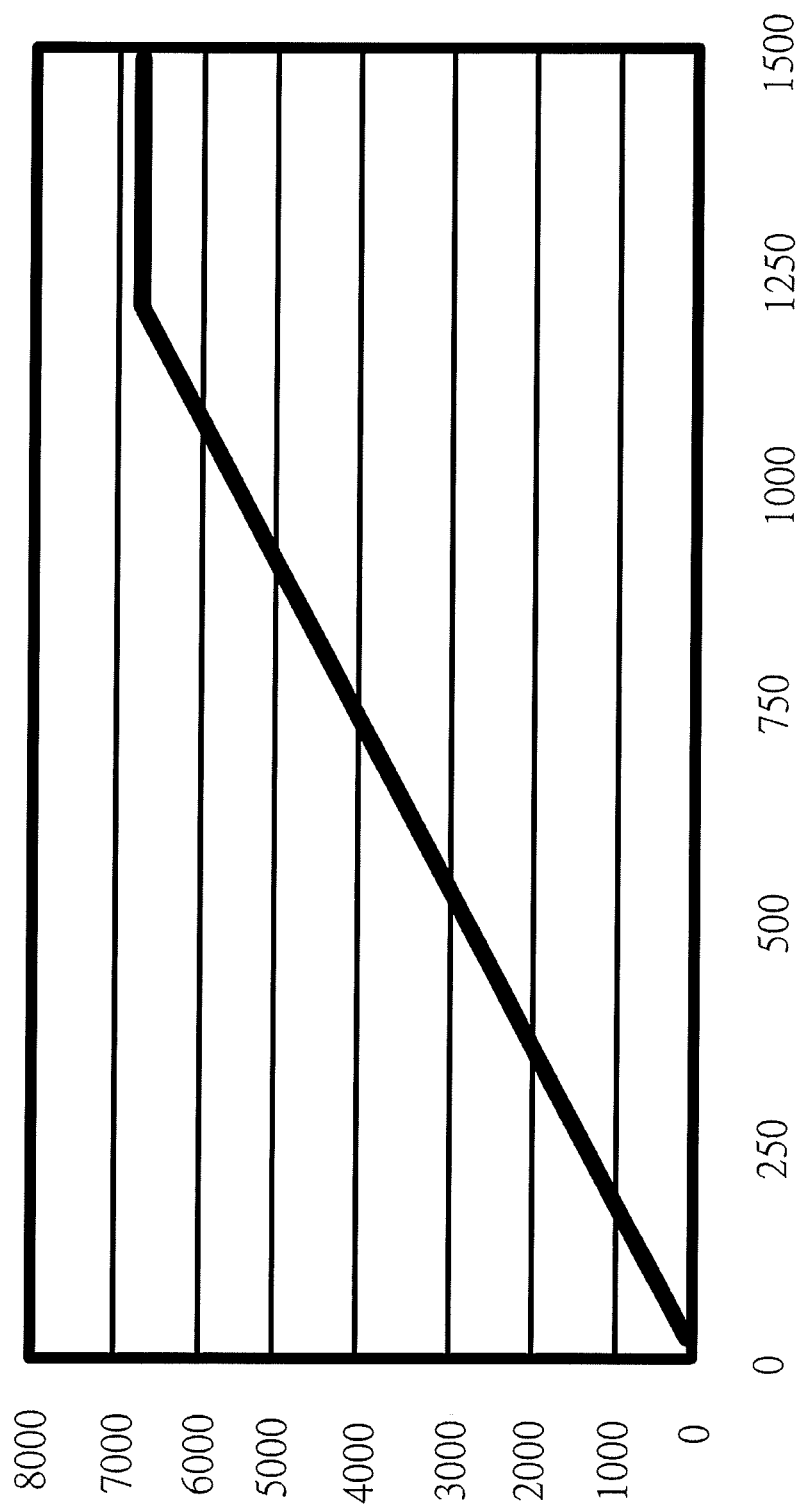
FIG. 6 shows a graph of mass change per time for about 100 deposition cycles of forming an organic polymeric film on a coupon according to embodiments disclosed herein.
Figure 7:
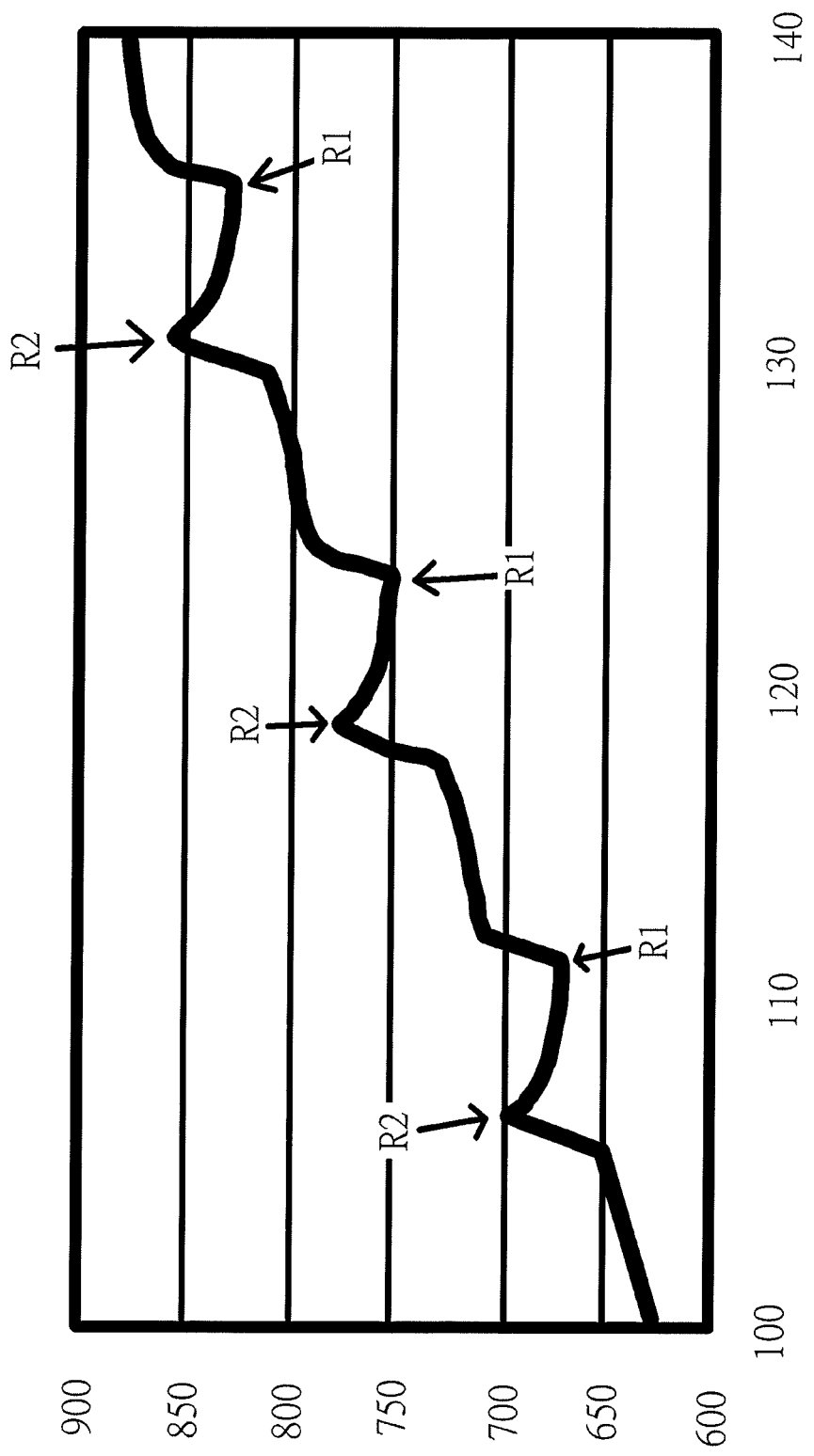
FIG. 7 shows an exploded view of a portion of the graph of FIG. 6.
Figure 8:
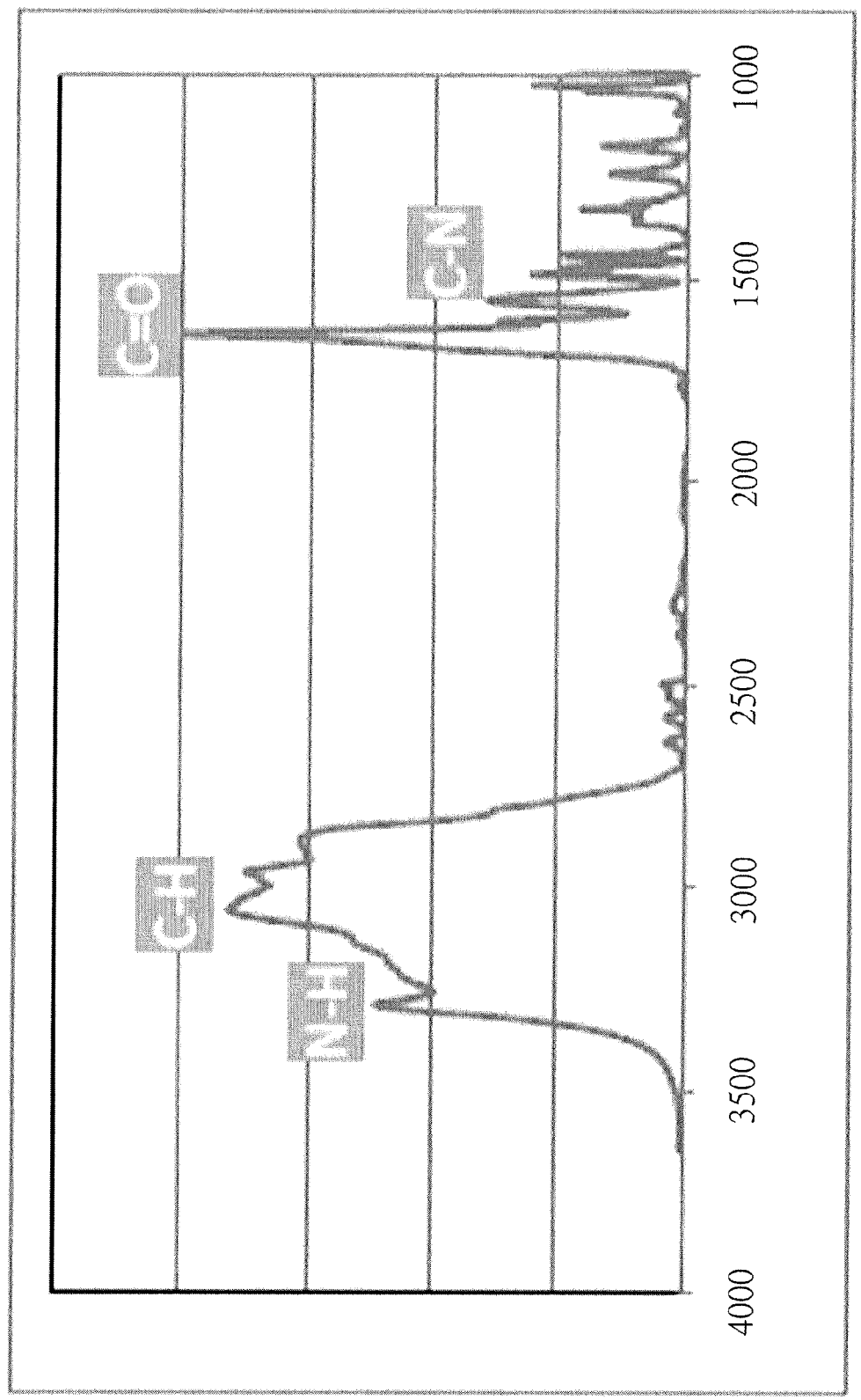
FIG. 8 shows the composition of the organic polymeric film deposited according to embodiments disclosed herein.

FIG. 6 is a graph of mass change ($ng/cm^2$) per time (seconds) of about 100 deposition cycles wherein each cycle includes a first reactant of malonoyl dichloride flowed for about 1 second, a purge flow of about 5 seconds, a second reactant of 1,2-ethanediamine flowed for about 1 second, and a final purge flow of about 5 second purges, wherein the deposition cycles form an organic polymeric film on the surface of a coupon in a vacuum chamber which has a continuous pressure of about 2 Torr. FIG. 7 is an exploded view of the graph of FIG. 6, which shows a graph of mass change ($ng/cm^2$) per time (seconds) of about 4 deposition cycles of the 100 deposition cycles of FIG. 6. FIG. 8 shows the organic polymeric film composition of the film deposited according to the flow periods shown in FIGS. 6 and 7. As shown in FIG. 8 the organic polymeric film includes carbon, hydrogen, nitrogen, and oxygen, and is consistent with the make-up of a polyamide material.

In an embodiment, the method includes sequentially processing semiconductor substrates in the vacuum chamber of the semiconductor substrate processing apparatus wherein the plasma or process gas exposed surfaces of the vacuum chamber include an organic polymeric film thereon. For example, a plasma etching or deposition process can be performed. The method also includes performing a vacuum chamber clean after processing a number of semiconductor substrates such as a cassette of semiconductor substrates wherein the polymeric film is etched off of the plasma or process gas exposed surfaces of the vacuum chamber during the chamber clean. An oxygen plasma can be used during the chamber clean wherein the oxygen plasma can remove the organic polymeric film and any residue deposits from the processing of semiconductor substrates in the vacuum chamber of the semiconductor substrate processing apparatus. After the organic polymeric film has been removed the plasma or process gas exposed surfaces of the vacuum chamber can be reconditioned by forming a new organic polymeric film on plasma or process gas exposed surfaces according to embodiments of methods disclosed herein.

Referring back to FIGS. 1 and 2, the controller 228 preferably controls the flow of the first reactant, the second reactant, and the purge gas delivered from the mass flow controller 302. A non-transitory computer machine-readable medium preferably comprises program instructions for control of the flow of the first reactant, the second reactant, and the purge gas. The controller 228 preferably also controls the pressure in the vacuum chamber 201 wherein a non-transitory computer machine-readable medium comprises program instructions for control of the pressure in the vacuum chamber 201.

Although the foregoing embodiments have been described in some detail for purposes of clarity of understanding, it will be apparent that certain changes and modifications may be practiced within the scope of the appended claims. Accordingly, the present embodiments are to be considered as illustrative and not restrictive, and the embodiments as disclosed herein are not to be limited to the details given herein, but may be modified within the scope and equivalents of the appended claims.

What is claimed is:

1. A method of conditioning a vacuum chamber of a semiconductor substrate processing apparatus by forming an organic polymeric film on plasma or process gas exposed surfaces of the vacuum chamber, the method comprising:
   (a) flowing a first reactant in vapor phase of a diacyl chloride into the vacuum chamber and allowing the first reactant to adsorb onto plasma or process gas exposed surfaces of the vacuum chamber;
   (b) purging the vacuum chamber with a purge gas after a flow of the first reactant has ceased to purge excess first reactant from the vacuum chamber;
   (c) flowing a second reactant in vapor phase into the vacuum chamber selected from the group consisting of a diamine, a diol, a thiol, and a trifunctional compound wherein the first and second reactants react to form a layer of an organic polymeric film on the plasma or process gas exposed surfaces of the vacuum chamber; and
   (d) purging the vacuum chamber with the purge gas after a flow of the second reactant has ceased to purge excess second reactant and reaction byproducts from the vacuum chamber.

2. The method of claim 1, wherein the first reactant of diacyl chloride is selected from the group consisting of ethanedioyl dichloride, malonoyl dichloride, succinyl dichloride, pentanedioyl dichloride, and combinations thereof.

3. The method of claim 1, wherein:
   the second reactant of a diamine is selected from the group consisting of 1,2-ethanediamine, 1,3-propanediamine, 1,4-butanediamine, and combinations thereof;
   the second reactant of a diol is selected from the group consisting of ethylene glycol, 1,3-propanediol, 1,4-butanediol, and combinations thereof; or
   the second reactant of a thiol is selected from the group consisting of 1,2-ethanedithiol, 1,3-propanedithiol, 1,4-butanedithiol, and combinations thereof.

4. The method of claim 1, wherein the organic polymeric film is free of halogens and/or free of silicon.

5. The method of claim 1, wherein:
   the organic polymeric film includes only carbon, oxygen, hydrogen, and optionally nitrogen and/or sulfur; and/or
   terminal ends of the molecules forming the organic polymeric film form a hydroxyl, an amine, or a thiol.

6. The method of claim 1, wherein the second reactant of a trifunctional compound is selected from the group consisting of (±)-3-amino-1,2-propanediol, glycerol, bis(hexamethylene)triamine, melamine, diethylenetriamine, (±)-1,2,4-butanetriol, cyanuric chloride, and combinations thereof.

7. The method of claim 1, wherein the purge gas is selected from the group consisting of He, Ar, Ne, $H_2$, $N_2$, and combinations thereof.

8. The method of claim 1, further comprising:
   repeating (a)-(d) at least twice to form the organic polymeric film to a desired thickness; and/or
   repeating (a)-(d) for less than about one hour wherein the first reactant is flowed into the vacuum chamber for about 0.1 to 10 seconds, the second reactant is flowed into the vacuum chamber for about 0.1 to 10 seconds, and the purging of the first or second reactants is performed for about 1 to 10 seconds.

9. The method of claim 1, wherein the thickness of the organic polymeric film formed in (d) about 0.1 to 1 nm.

10. The method of claim 1, wherein the temperature of the plasma or process gas exposed surfaces of the vacuum chamber is about 20° to 350° C. and/or the pressure in the vacuum chamber is about 1 to 4 Torr.

11. The method of claim 1, further comprising:
    sequentially processing semiconductor substrates supported on a pedestal module in the vacuum chamber of the semiconductor substrate processing apparatus;
    performing a vacuum chamber clean after processing a cassette of semiconductor substrates, wherein the organic polymeric film is etched off of the plasma or process gas exposed surfaces of the vacuum chamber; and
    reconditioning the plasma or process gas exposed surfaces of the vacuum chamber by forming an organic polymeric film of the plasma or process gas exposed surfaces according to the method of claim 1.

12. The method of claim 1, further comprising supporting a substrate on a pedestal module inside the vacuum chamber while forming the organic polymeric film such that the organic polymeric film is not formed on an upper surface of the pedestal module.

13. The method of claim 1, further comprising after (d) performing a plasma etching or deposition process on a semiconductor substrate supported on a pedestal module in the vacuum chamber.

14. The method of claim 1, wherein the first reactant is flowed into the vacuum chamber for about 0.1 to 10 seconds, the second reactant is flowed into the vacuum chamber for about 0.1 to 10 seconds, and/or the purging of the first or second reactants is performed for about 1 to 10 seconds.

15. The method of claim 1, further comprising:
    controlling the flow of the first reactant, the second reactant, and the purge gas with a controller wherein a non-transitory computer machine-readable medium comprises program instructions for control of the flow of the first reactant, the second reactant, and the purge gas; and/or
    controlling the pressure in the vacuum chamber with a controller wherein a non-transitory computer machine-readable medium comprises program instructions for control of the pressure in the vacuum chamber.

* * * * *